(12) United States Patent
Chen et al.

(10) Patent No.: US 10,658,508 B2
(45) Date of Patent: May 19, 2020

(54) STRUCTURE AND FORMATION METHOD OF SEMICONDUCTOR DEVICE WITH LOW RESISTANCE CONTACT

(71) Applicant: Taiwan Semiconductor Manufacturing Co., Ltd., Hsinchu (TW)

(72) Inventors: Chia-Cheng Chen, Hsinchu (TW); Su-Hao Liu, Jhongpu Township, Chiayi County (TW); Kuo-Ju Chen, Taichung (TW); Liang-Yin Chen, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/038,866

(22) Filed: Jul. 18, 2018

(65) Prior Publication Data

US 2019/0157456 A1 May 23, 2019

Related U.S. Application Data

(60) Provisional application No. 62/587,875, filed on Nov. 17, 2017.

(51) Int. Cl.
*H01L 29/78* (2006.01)
*H01L 29/08* (2006.01)
(Continued)

(52) U.S. Cl.
CPC .... *H01L 29/7848* (2013.01); *H01L 21/02381* (2013.01); *H01L 21/02532* (2013.01); *H01L 21/02579* (2013.01); *H01L 21/02667* (2013.01); *H01L 21/2236* (2013.01); *H01L 21/30625* (2013.01); *H01L 21/76224* (2013.01); *H01L 27/0886* (2013.01); *H01L 29/0847* (2013.01); *H01L 29/41791* (2013.01);
(Continued)

(58) Field of Classification Search
CPC ............. H01L 29/66795; H01L 29/785; H01L 29/0847; H01L 21/823431; H01L 29/7848; H01L 29/66545
USPC ........................................ 438/283, 478, 507
See application file for complete search history.

(56) References Cited

U.S. PATENT DOCUMENTS

| 8,772,109 B2 | 7/2014 | Colinge |
| 8,785,285 B2 | 7/2014 | Tsai et al. |

(Continued)

*Primary Examiner* — Jonathan Han
(74) *Attorney, Agent, or Firm* — Birch, Stewart, Kolasch & Birch, LLP

(57) ABSTRACT

Structures and formation methods of a semiconductor device structure are provided. The method includes forming a fin structure over a semiconductor substrate and forming a gate stack over the fin structure. The method also includes forming an epitaxial structure over the fin structure. The method further includes forming a dielectric layer over the epitaxial structure and forming an opening in the dielectric layer to expose the epitaxial structure. In addition, the method includes forming a modified region in the epitaxial structure. The modified region has lower crystallinity than an inner portion of the epitaxial structure and extends along an entirety of an exposed surface of the epitaxial structure. The method also includes forming a semiconductor-metal compound region on the epitaxial structure. All or some of the modified region is transformed into the semiconductor-metal compound region.

20 Claims, 12 Drawing Sheets

(51) Int. Cl.

| | |
|---|---|
| *H01L 29/417* | (2006.01) |
| *H01L 21/762* | (2006.01) |
| *H01L 29/66* | (2006.01) |
| *H01L 27/088* | (2006.01) |
| *H01L 21/02* | (2006.01) |
| *H01L 21/306* | (2006.01) |
| *H01L 21/223* | (2006.01) |
| *H01L 29/165* | (2006.01) |

(52) U.S. Cl.
CPC ...... *H01L 29/665* (2013.01); *H01L 29/66795* (2013.01); *H01L 29/785* (2013.01); *H01L 29/165* (2013.01); *H01L 29/66545* (2013.01)

(56) References Cited

U.S. PATENT DOCUMENTS

| | | |
|---|---|---|
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |
| 9,576,814 B2 | 2/2017 | Wu et al. |
| 2014/0167264 A1* | 6/2014 | Besser ................ H01L 29/4916 257/741 |
| 2014/0273369 A1* | 9/2014 | Wei ................ H01L 21/823821 438/232 |
| 2015/0214105 A1* | 7/2015 | Zhang ............... H01L 21/02634 257/754 |
| 2016/0020209 A1* | 1/2016 | Anderson ............ H01L 21/845 257/383 |

\* cited by examiner

STRUCTURE AND FORMATION METHOD OF SEMICONDUCTOR DEVICE WITH LOW RESISTANCE CONTACT

PRIORITY CLAIM AND CROSS-REFERENCE

This Application claims the benefit of U.S. Provisional Application No. 62/587,875, filed on Nov. 17, 2017, the entirety of which is incorporated by reference herein.

BACKGROUND

The semiconductor integrated circuit (IC) industry has experienced rapid growth. Technological advances in IC materials and design have produced generations of ICs. Each generation has smaller and more complex circuits than the previous generation.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, these advances have increased the complexity of processing and manufacturing ICs. Since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
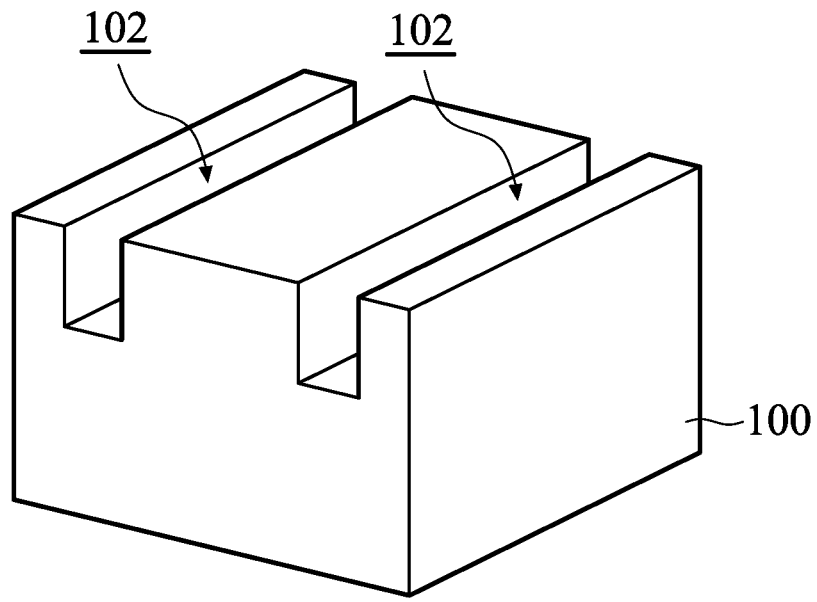
FIGS. 1A-1G are perspective views of various stages of a process for forming a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Embodiments of the disclosure may relate to FinFET structure having fins. The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. However, the fins may be formed using one or more other applicable processes.

FIGS. 1A-1G are perspective views of various stages of a process for forming a semiconductor device structure, in accordance with some embodiments of the present disclosure. As shown in FIG. 1A, a semiconductor substrate 100 is received or provided. In some embodiments, the semiconductor substrate 100 is a bulk semiconductor substrate, such as a semiconductor wafer. For example, the semiconductor substrate 100 includes silicon or other elementary semiconductor materials such as germanium. The semiconductor substrate 100 may be un-doped or doped (e.g., p-type, n-type, or a combination thereof). In some other embodiments, the semiconductor substrate 100 includes a compound semiconductor. The compound semiconductor may include silicon carbide, gallium arsenide, indium arsenide, indium phosphide, one or more other suitable compound semiconductors, or a combination thereof. In some embodiments, the semiconductor substrate 100 is an active layer of a semiconductor-on-insulator (SOI) substrate. The SOI substrate may be fabricated using a separation by implantation of oxygen (SIMOX) process, a wafer bonding process, another applicable method, or a combination thereof. In some other embodiments, the semiconductor substrate 100 includes a multi-layered structure. For example, the semiconductor substrate 100 includes a silicon-germanium layer formed on a bulk silicon layer.

As shown in FIG. 1A, two or more trenches 102 are formed in the semiconductor substrate 100, in accordance with some embodiments. The trenches 102 may be formed using a masking element (not shown) along with one or more suitable etching processes. For example, the masking element is a hard mask that includes a single layer or multiple layers made of silicon nitride, silicon oxide, silicon oxynitride, silicon carbide, one or more other suitable materials, or a combination thereof. Alternatively, the mask element may be made of a photoresist material. The formation of the mask element may involve one or more deposition processes and one or more patterning processes. Through the patterning processes, the mask element may define multiple openings. The openings expose the positions where the trenches 102 are to be formed. Afterwards, with the mask element as an etching mask, one or more etching processes, such as a reactive ion etching (RIE) process, are used to partially remove the semiconductor substrate 100 exposed by the openings of the mask element. As a result, the trenches 102 are formed in the semiconductor substrate 100, as shown in FIG. 1A. As explained below with respect to FIG. 1B, the area of the semiconductor substrate 100 between the trenches 102 is afterwards patterned to form individual semiconductor fins, in accordance with some embodiments.

Figure 1B:
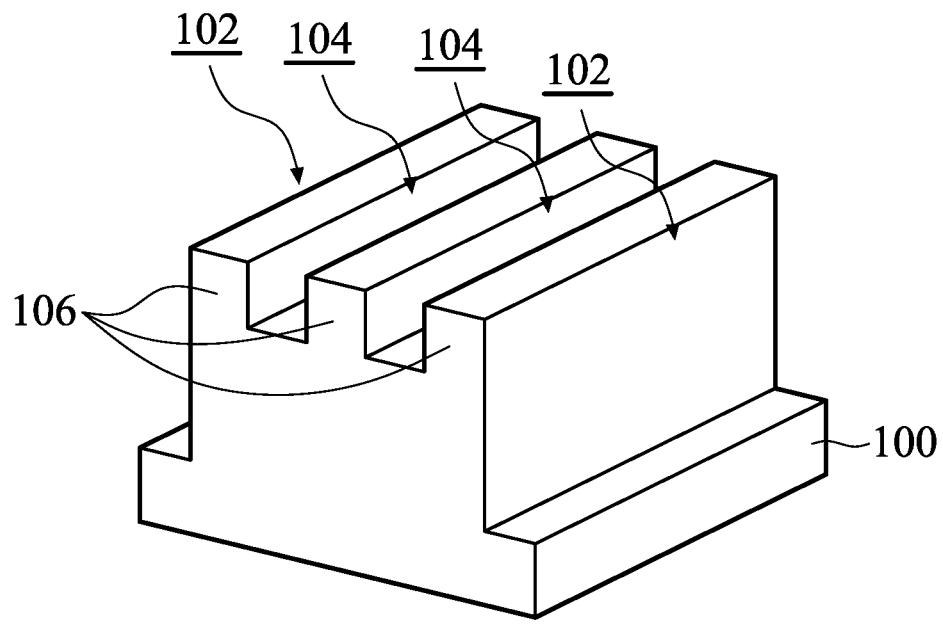

Reference is made to FIG. 1B. For the sake of clarity, portions of the semiconductor substrate 100 adjacent to the trenches 102 are not shown in FIG. 1B. Therefore, the interior of the trenches 102 is shown in FIG. 1B. As shown in FIG. 1B, one or more trenches 104 are formed between the trenches 102, and the trenches 102 are deepened, in accordance with some embodiments. After the formation of the trenches 104, multiple semiconductor fins 106 are defined, as shown in FIG. 1B. The trenches 104 may serve as isolation regions between separate semiconductor fins 106. The semiconductor fins 106 may share a common (or similar) gate and/or common (or similar) source and drain features. The trenches 102 that extend deeper into the semiconductor substrate 100 than the trenches 104 may serve as isolation regions that are positioned between semiconductor fins that do not share a common (or similar) gate, source, and/or drain features.

Similar to the trenches 102 shown in FIG. 1A, the trenches 104 may be formed using a suitable masking and photolithography process followed by an etching process. In some embodiments, the etching process used for forming the trenches 104 is also used to deepen the trenches 102 of FIG. 1A, such that the trenches 102 in FIG. 1B extend into the semiconductor substrate 100 a further distance. Therefore, the trenches 102 are deeper than the trenches 104, as shown in FIG. 1B. In some embodiments, a mask element (not shown) is used during the etching process for forming the trenches 104 and deepening the trenches 102. The mask element has openings that expose the trenches 102 and the areas of the semiconductor substrate 100 where the trenches 104 are designed to be formed.

In some embodiments, the trenches 102 and 104 have sharp corners, as shown in FIG. 1B. However, embodiments of the disclosure are not limited thereto. Many variations and/or modifications can be made to embodiments of the disclosure. In some other embodiments, the trenches 102 and 104 have round corners. The etching conditions may be tuned to modify the profile of the trenches 102 and 104.

However, the process described above to form the trenches 102 and 104 is one potential process, and is not meant to be limited with this respect. Rather, other suitable process through which the trenches 102 and 104 may be formed such that the trenches 102 extend into the semiconductor substrate 100 further than the trenches 104 may be utilized. For example, the trenches 102 may be formed in a single etch step and then protected during the formation of the trenches 104. Other suitable process, including any number of masking and removal processes may alternatively be used.

After the formation of the trenches 104, portions of the semiconductor substrate 100 that remain un-removed form the semiconductor fins 106, as shown in FIG. 1B. These semiconductor fins 106 may be used, as discussed below, to form the channel region of the semiconductor device. While FIG. 1B illustrates three semiconductor fins 106 formed from the semiconductor substrate 100, any number of semiconductor fins 106 that are greater than one may be formed. In some embodiments, the semiconductor fins 106 may form a separate channel region while still being close enough to share a common gate (whose formation is discussed below in relation to FIG. 1D).

Figure 1C:
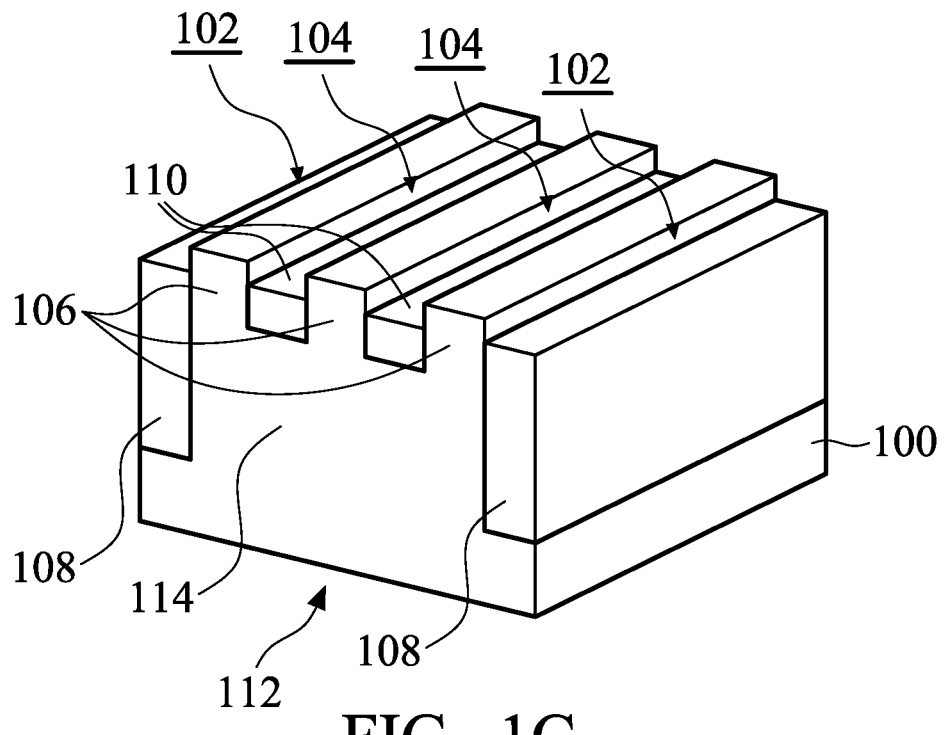

As shown in FIG. 1C, isolation structures 108 and 110 are respectively formed in the trenches 102 and 104, in accordance with some embodiments. In some embodiments, the trenches 102 and 104 are filled with a dielectric material. Afterwards, the dielectric material is recessed within the trenches 102 and 104 to respectively form isolation structures 108 (referred as second isolation structures or inter-device isolation structures) and 108 (referred as first isolation structures or intra-device isolation structures). In some embodiments, the isolation structures 108 extend into the semiconductor substrate 100 further than the isolation structures 110.

As shown in FIG. 1C, the isolation structures 108 define a crown structure 112 (or a crown active region) in the semiconductor substrate 100. The isolation structures 110 define a plurality of the semiconductor fins 106 in the crown structure 112. The crown structure 112 (or the crown active region) includes the semiconductor fins 106, the isolation structure 110, and a continuous semiconductor region 114. The continuous semiconductor region 114 is underlying the semiconductor fins 106 and the isolation structure 110. In some embodiments, the semiconductor fins 106 extend upwards from the continuous semiconductor region 114.

The dielectric material used for forming the isolation structures 108 and 110 may be an oxide material, a high-density plasma (HDP) oxide material, or the like. The dielectric material may be formed, after an optional cleaning and lining of the trenches 102 and 104, using either a CVD method (e.g., the high aspect ratio process (HARP)), a high density plasma CVD method, an atomic layer deposition (ALD) process, one or more other applicable processes, or a combination thereof.

The trenches 102 and 104 may be filled by overfilling the trenches 102 and 104 and the semiconductor substrate 100 with the dielectric material and then removing the excess material outside of the trenches 102 and 104 and the semiconductor substrate 100. For example, a chemical mechanical polishing (CMP) process, an etching process, a mechanical grinding process, a dry polishing process, one or more other applicable processes, or a combination thereof may be used to partially remove the dielectric material. In some embodiments, the removal process removes any dielectric material that is located over the semiconductor substrate 100 as well, so that the removal of the dielectric material will expose the surface of the semiconductor substrate 100 to further processing operations.

After the trenches 102 and 104 have been filled with the dielectric material, the dielectric material may then be recessed away from the surface of the semiconductor substrate 100. The recessing may be performed to expose a portion of the sidewalls of the semiconductor fins 106. The dielectric material may be recessed using a wet etching process, a dry etching process, or a combination thereof. The recessing may also remove any leftover dielectric material located over the semiconductor substrate 100 to ensure that the semiconductor substrate 100 is exposed for further processing.

In should be noted that, however, the steps described above may be only part of the overall process flow used to fill and recess the dielectric material. For example, lining steps, cleaning steps, annealing steps, gap filling steps, one or more other applicable steps, or a combination thereof may also be utilized to form and fill the trenches 102 and 104 with the dielectric material. The potential process steps are also intended to be included within the scope of the embodiments of the disclosure.

Figure 1D:
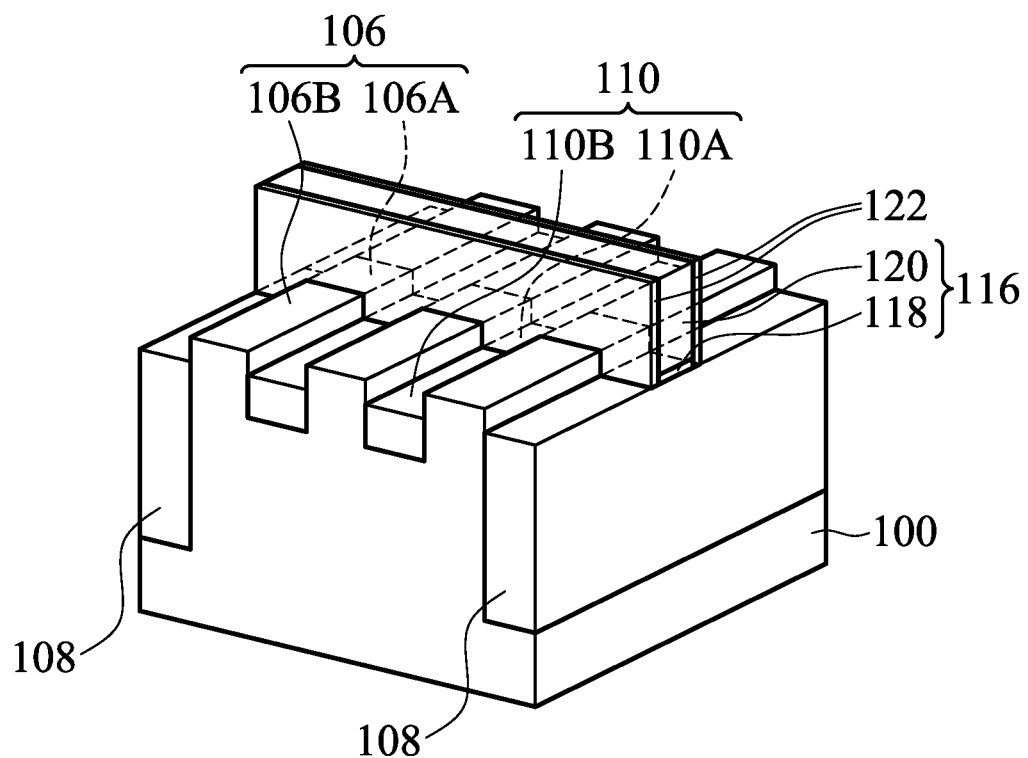

As shown in FIG. 1D, a gate stack 116 is formed over a portion of the semiconductor fins 106, in accordance with some embodiments. The gate stack 116 extends along the sidewalls and top surfaces of the semiconductor fins 106. The gate stack 116 may also extend on the isolation structures 108 and 110. The gate stack 116 defines multiple channel regions (i.e., first portions 106A) of the semiconductor fins 106. The channel regions are underneath the gate dielectric layer 118. The gate stack 116 includes a gate dielectric 118 and a gate electrode 120.

In some embodiments, the gate dielectric 118 is made of or includes silicon oxide, silicon oxynitride, one or more other suitable materials, or a combination thereof. In some other embodiments, the gate dielectric layer 118 is made of or includes a high permittivity (high-k) material. The high-k material may have a relative permittivity greater than about 5. The high-k material may include lanthanum oxide, aluminum oxide, hafnium oxide, hafnium oxynitride, zirconium oxide, one or more other suitable materials, or a combination thereof. In some other embodiments, combinations of silicon oxide, silicon oxynitride, and/or high-k materials are used for the gate dielectric layer 118.

The gate dielectric layer 118 may be deposited using a CVD process, an ALD process, a PVD process, a thermal oxidation process, a spin-on process, one or more other applicable processes, or a combination thereof. Depending on the technique used for forming the gate dielectric layer 118, a thickness of the gate dielectric 118 on the top of the semiconductor fins 106 may be different from a thickness of the gate dielectric 118 on the sidewall of the semiconductor fins 106.

As shown in FIG. 1D, the gate electrode 120 is formed over the gate dielectric layer 118. The gate electrode 120 may include a conductive material. In some embodiments, the gate electrode 120 is made of or includes polycrystalline-silicon (poly-Si), poly-crystalline silicon-germanium (poly-SiGe), metallic nitrides, metallic silicides, metallic oxides, metals, one or more other suitable materials, or a combination thereof. Examples of metallic nitrides include tungsten nitride, molybdenum nitride, titanium nitride, and tantalum nitride, one or more other suitable materials, or a combination thereof. Examples of metallic silicide include tungsten silicide, titanium silicide, cobalt silicide, nickel silicide, platinum silicide, erbium silicide, one or more other suitable materials, or a combination thereof. Examples of metallic oxides include ruthenium oxide, indium tin oxide, one or more other suitable materials, or a combination thereof. Examples of metal include tungsten, titanium, aluminum, copper, molybdenum, nickel, platinum, one or more suitable materials, or a combination thereof.

The gate electrode 120 may be deposited using a CVD process, an ALD process, a PVD process, an electroplating process, an electroless plating process, one or more other applicable processes, or a combination thereof. In some embodiments, ions are introduced into the gate electrode 120. Ions may be introduced, for example, by ion implantation techniques.

The gate dielectric layer 118 and the gate electrode 120 may be patterned to form the gate stack 116. In some embodiments, the gate stack 116 is a dummy gate stack that will be replaced with another gate stack (such as a metal gate stack) in subsequent processes. In these cases, the gate dielectric layer 118 may be a dummy gate dielectric layer made of silicon oxide and/or silicon oxynitride. The gate electrode 120 may be a dummy gate electrode made of polysilicon.

Afterwards, spacer elements 122 are formed, as shown in FIG. 1D in accordance with some embodiments. The spacer elements 122 may be formed on opposing sidewalls of the gate stack 116. In some embodiments, the spacer elements 122 are formed by blanket depositing a spacer layer (not shown) over the previously formed structure. The spacer layer may be made of or include silicon nitride, silicon carbide, silicon oxynitride, silicon oxycarbide, one or more other suitable materials, or a combination thereof. The spacer layer may be formed using a CVD process, an ALD process, a spin-on process, one or more other applicable processes, or a combination thereof. Afterwards, an etching process may be used to partially remove the spacer layer. As a result, the spacer elements 122 are formed. The etching conditions may be tuned to form the spacer elements 122 with desired profile.

As shown in FIG. 1D, the gate stack 116 and the spacer elements 122 cover the first portions 106A of the semiconductor fins 106 while leaving second portions 106B of the semiconductor fins 106 uncovered. That is, the second portions 106B is exposed without being covered by the gate stack 116 and the spacer elements 122.

As shown in FIG. 1D, each of the isolation structures 110 has a first portion 110A and a second portion 110B. The gate stack 116 and the spacer elements 122 cover the first portions 110A of the isolation structures 110 while leaving the second portions 110B uncovered. That is, the second portions 110B of the isolation structures 110 are exposed without being covered by the gate stack 116 and the spacer elements 122.

Figure 1E:
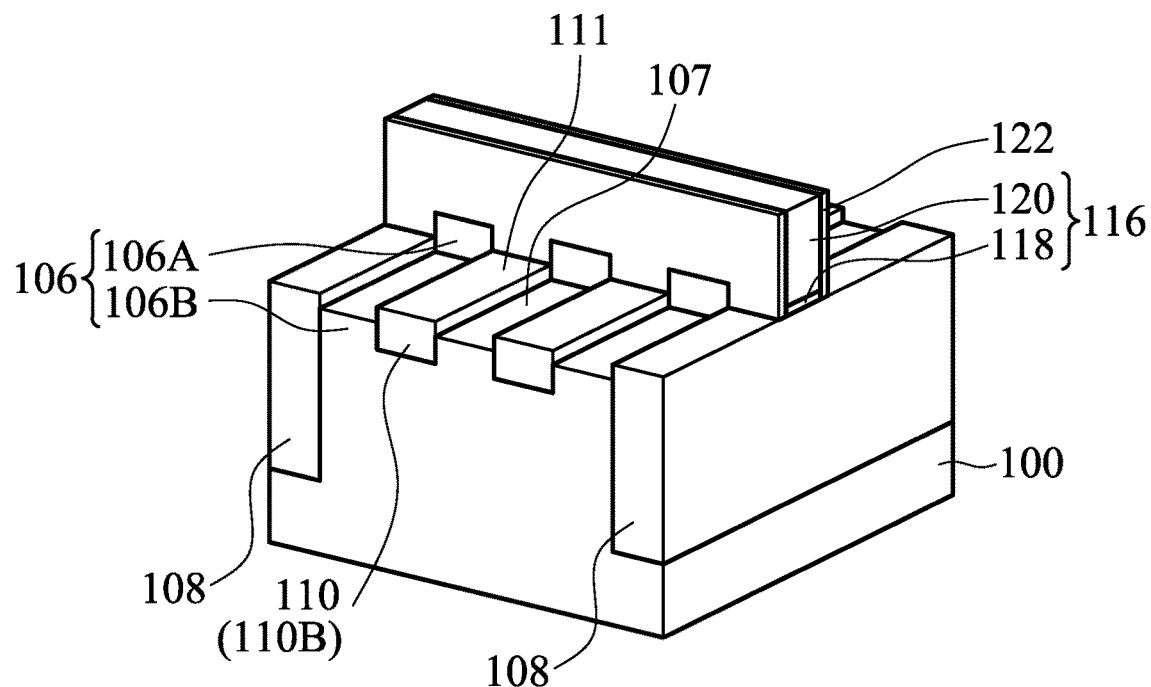

As shown in FIG. 1E, the semiconductor fins 106 are partially removed, in accordance with some embodiments. Parts of the second portions 106B of the semiconductor fins 106 are removed from those areas not protected by the gate stack 116 and spacer elements 122. In some embodiments, top surfaces 107 of the remaining second portions 106B of the semiconductor fins 106 are below the top surfaces 111 of the second portions 110B of the isolation structure 110. This removal may be performed by an etching process (such as a reactive ion etch) using the gate stacks 116 and the spacer elements 122 as an etching mask. The etching conditions used in the etching process may be tuned to allow good control of an etching direction to achieve desired profiles for the remaining (or recessed) second portions 106B of the semiconductor fins 106. It is noted that although in FIG. 1E the remaining second portions 108 have sharp corners, embodiments of the disclosure are not limited thereto. In some other embodiments, the remaining second portions 106B have round corners.

Figure 1F:
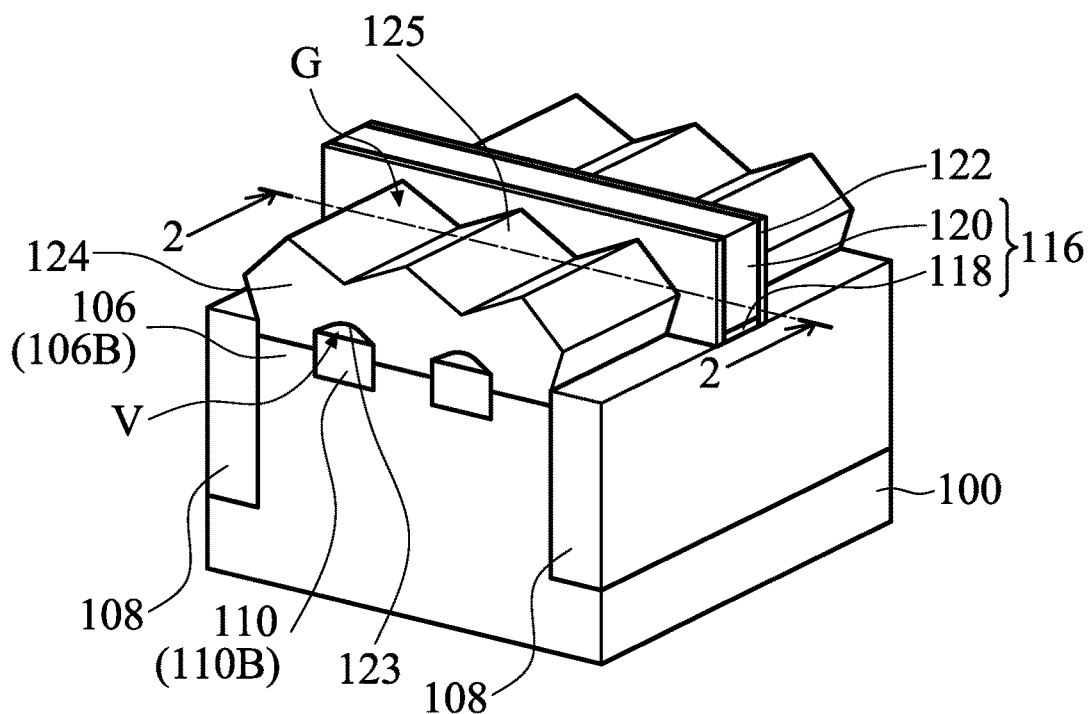
Figure 2A:
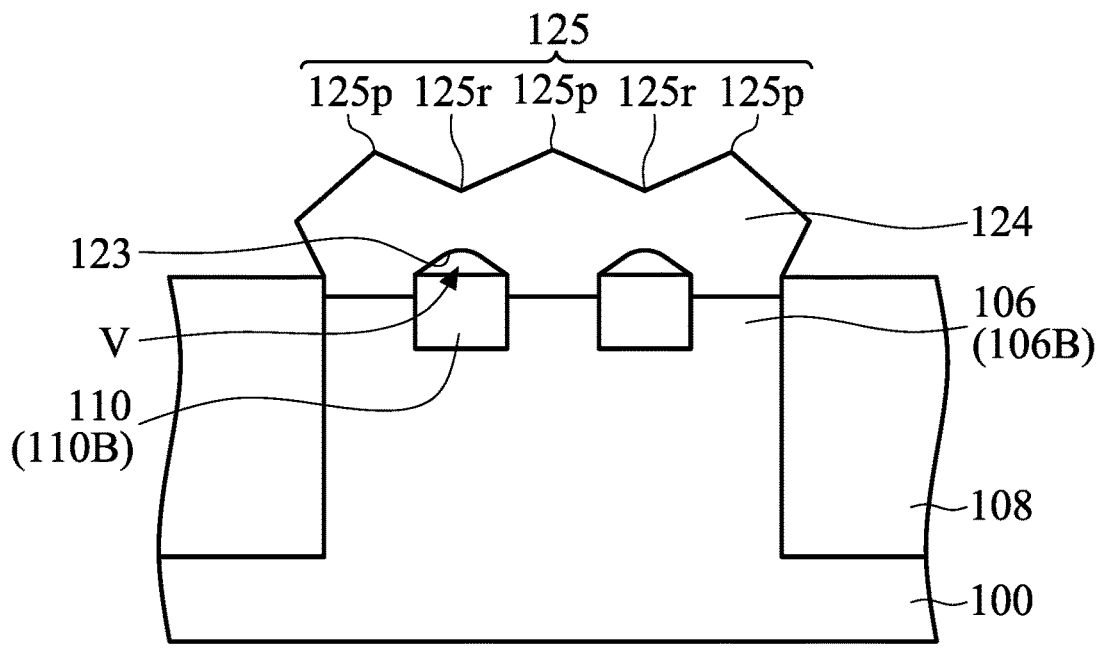
FIGS. 2A-2F are cross-sectional views of various stages of a process for forming a semiconductor device structure, in accordance with some embodiments.

As shown in FIG. 1F, source/drain structures 124 are formed on the remaining second portions 106B of the semiconductor fins 106, in accordance with some embodiments. FIGS. 2A-2F are cross-sectional views of various stages of a process for forming a semiconductor device structure, in accordance with some embodiments of the present disclosure. In some embodiments, FIG. 2A shows the cross-sectional view of the structure shown in FIG. 1F taking along the line 2-2.

As shown in FIG. 1F and 2A, the source/drain structures 124 extend on the second portions 110B of the isolation structures 110, in accordance with some embodiments. In some embodiments, the source/drain structures 124 are epitaxial structure structures. In some embodiments, the source/drain structures 124 and the second portions 110B of the isolation structures 110 together surround multiple voids V.

For example, in FIGS. 1F and 2, the source/drain structures 124 leave two voids V respectively on the second portions 110B of the isolation structures 110. Since the lattice constant of the source/drain structures 124 is different from that of the semiconductor substrate 100, the channel regions (106A) of the semiconductor fins 106 are strained or stressed to improve carrier mobility of the device and enhance the device performance.

In some embodiments, the source/drain structures 124 are made of or include silicon germanium, silicon, one or more other suitable materials, or a combination thereof. In these cases, the source/drain structures 124 may be used as source/drain regions of a p-type semiconductor device, such as a p-type FinFET. In some other embodiments, the source/drain structures 124 are made of or include silicon, silicon phosphorus, silicon carbide, one or more other suitable materials, or a combination thereof. In these cases, the source/drain structures 124 may be used as source/drain regions of an n-type semiconductor device, such as an n-type FinFET. In some embodiments, the source/drain structures 124 are epitaxially grown by a LPCVD process, an ALD process, one or more other applicable processes, or a combination thereof.

As shown in FIGS. 1F and 2A, each of the source/drain structures 124 has a top surface 125. A portion of the top surface 125 of the source/drain structures 124 is recessed. The top surface 125 of the source/drain structures 124 has at least one recessed surface portion 125r. The top surface 125 also has at least one peak portion 125p. The recessed surface portion 125r is local minimum of the top surface 125, and the peak portion 125p is a local maximum of the top surface 125. In some embodiments, the recessed surface portions 125r are respectively located above the second portions 110B of the isolation structures 110 to respectively form grooves G on the source/drain structures 124. In some embodiments, the top surface 125 is a wavy surface.

As shown in FIGS. 1F and 2A, each of the source/drain structures 124 has a bottom surface 123 adjacent to the void V. At least a portion of the bottom surface 123 of the source/drain structures 124 is recessed to form the void V. In some embodiments, the bottom surface 123 is a wavy surface.

Although the voids V are formed between the source/drain structures 124 and the isolation structures 110 in some embodiments, embodiments of the disclosure are not limited thereto. Many variations and/or modifications can be made to embodiments of the disclosure. In some other embodiments, the voids are not formed. In some embodiments, by tuning the growth conditions of the source/drain structures 124, there is no or substantially no void formed between the source/drain structures 124 and the isolation structures 110.

Figure 1G:
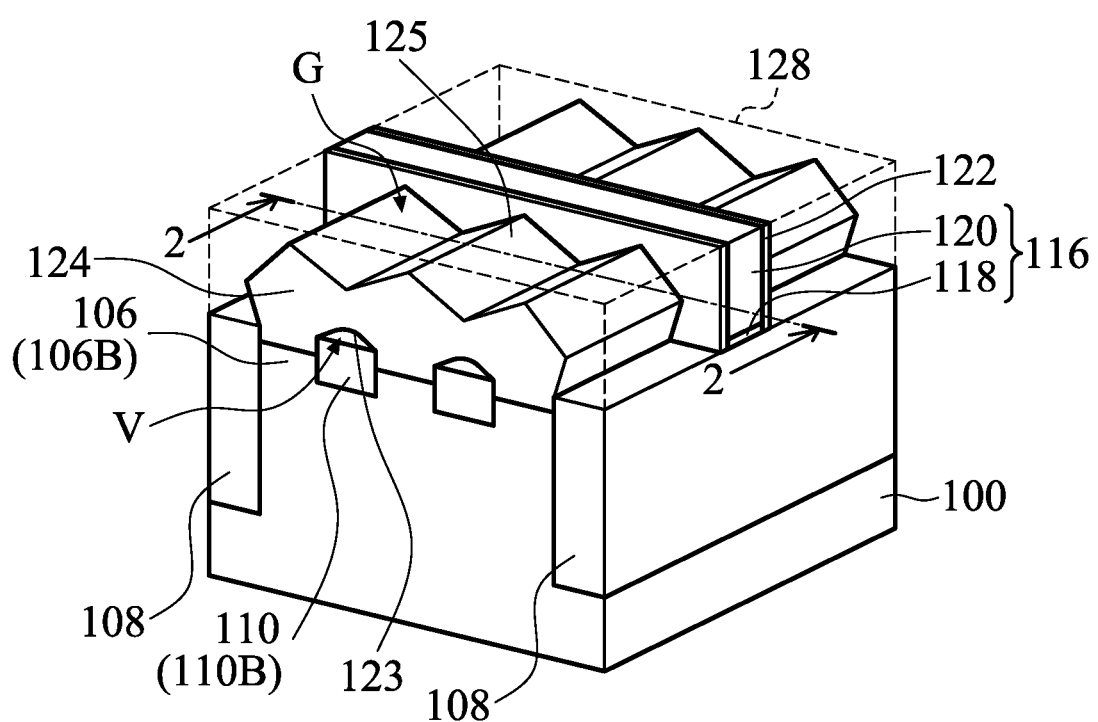
Figure 2B:
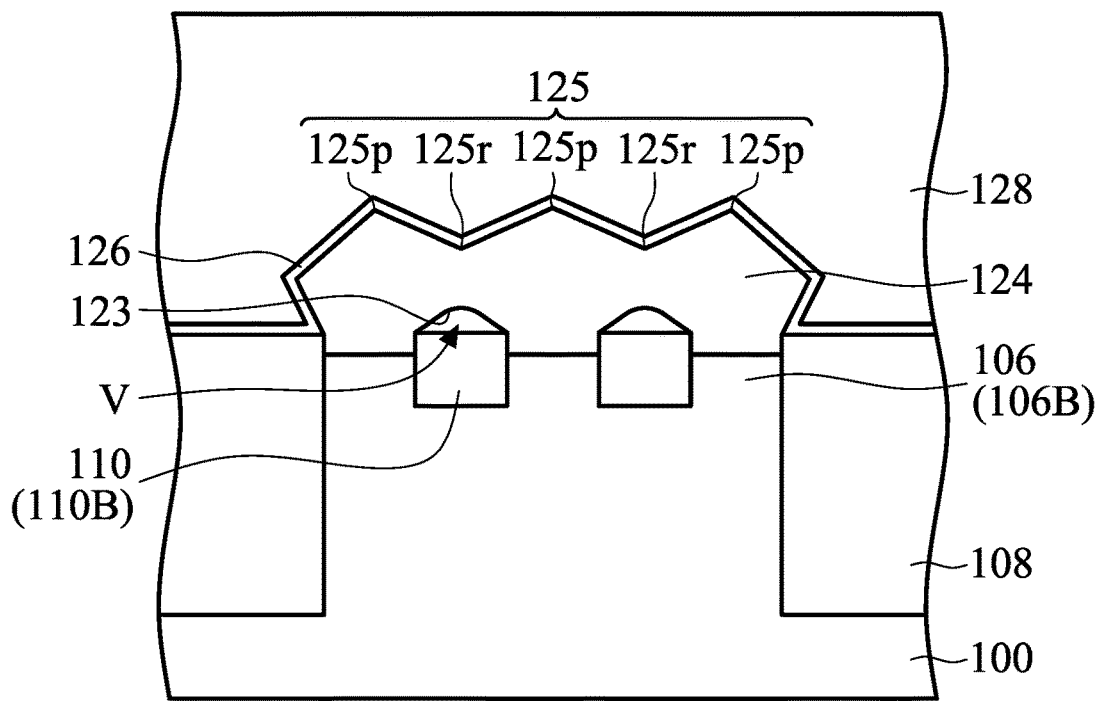

As shown in FIG. 2B, an etch stop layer 126 is deposited over the structure shown in FIG. 1F and 2A, in accordance with some embodiments. Afterwards, a dielectric layer 128 is deposited over the etch stop layer 126, as shown in FIG. 1G and 2B in accordance with some embodiments. In FIG. 1G, the dielectric layer 128 is shown by dotted lines. Therefore, some elements covered by the dielectric layer 128 are still shown in FIG. 1G for the sake of clarity. In FIG. 1G, the etch stop layer 126 below the dielectric layer 128 is not shown. The dielectric layer 128 surrounds the gate stack 116 and the source/drain structures 124.

As shown in FIG. 2B, the etch stop layer 126 conformally covers the sidewalls and the top surface 125 of the source/drain structures 124, in accordance with some embodiments. The etch stop layer 126 may also covers the sidewalls and top surface of the gate stack 116. The etch stop layer 126 may function as a contact etch stop layer during a subsequent contact opening formation step. The etch stop layer 126 may also be used as a protection layer to prevent the source/drain structures 124 from being oxidized. For example, oxygen ions from the dielectric layer 128 are blocked without reaching the source/drain structures 124.

The etch stop layer 126 may be made of or include silicon nitride, silicon carbide, silicon oxynitride, one or more other suitable materials, or a combination thereof. The etch stop layer 126 may be deposited using a CVD process, an ALD process, a spin-on process, one or more other applicable processes, or a combination thereof.

The dielectric layer 128 may be made of or include silicon oxide, silicon oxynitride, tetraethylorthosilicate (TEOS) oxide, phosphosilicate glass (PSG), borophosphosilicate glass (BPSG), fluorinated silica glass (FSG), carbon doped silicon oxide, amorphous fluorinated carbon, low-k dielectric material, one or more other suitable materials, or a combination thereof. The low-k dielectric material may have a dielectric constant (k value) less than about 3.9 or less than about 2.8.

In some embodiments, a dielectric material layer is deposited over the etch stop layer 126. The dielectric material layer may be deposited using a CVD process, an ALD process, a spin-on process, a spray coating process, a PVD process, one or more other applicable processes, or a combination thereof. In some embodiments, a planarization process is applied on the dielectric material layer. As a result, the dielectric layer 128 with a substantially planar top surface is formed. The planarization process may include a CMP process, a grinding process, a dry polishing process, an etching process, one or more other applicable processes, or a combination thereof.

In some embodiments, the planarization process is performed until the top surface of the gate stack 116 is exposed, as shown in FIG. 1G. The gate electrode 120 of the gate stack 116 is exposed after the planarization process. In some embodiments, the gate stack 116 is a dummy gate stack. A gate replacement process may be used to form a metal gate stack to replace the dummy gate stack.

In some embodiments, the gate electrode 120 and the gate dielectric layer 118 are removed to leave a recess between the spacer elements 408. Afterwards, a gate dielectric layer, one or more work function layers, and/or a metal filling layer are formed in the recess to form a metal gate stack. In some embodiments, a planarization process is used to remove the deposited material layers outside of the recess. In some embodiments, the top surface of the metal gate stack is substantially coplanar with the top surface of the dielectric layer 128. In some other embodiments, the metal gate stack fills a lower portion of the recess. A protective mask element may be formed on the metal gate stack to fill the recess. In some embodiments, the top surface of the hard mask element is substantially coplanar with the top surface of the dielectric layer 128.

Many variations and/or modifications can be made to embodiments of the disclosure. In some other embodiments, the gate stack 116 is not replaced with another gate stack.

Figure 2C:
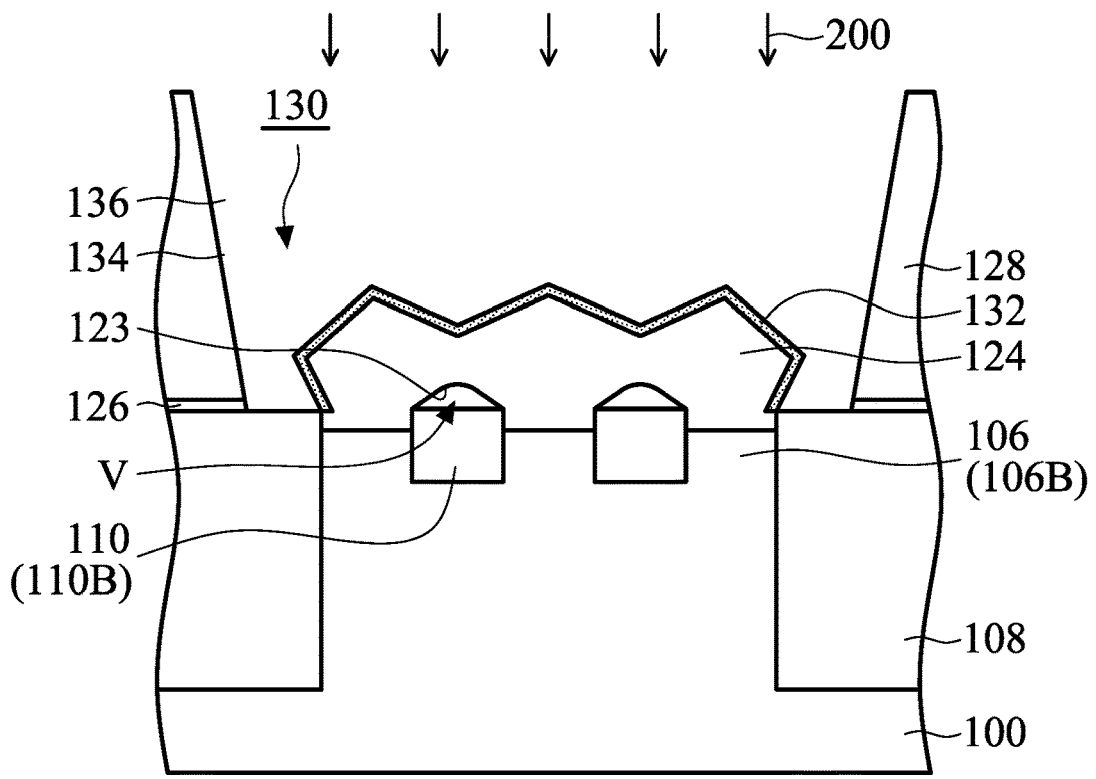

As shown in FIG. 2C, a contact opening 130 is formed in the dielectric layer 128 to expose the source/drain structure 124, in accordance with some embodiments. In some embodiments, a photolithography process and an etching process are used to partially remove the dielectric layer 128 until the etch stop layer 126 is exposed. Afterwards, another etching process may be used to remove the exposed portion of the etch stop layer 126. As a result, the source/drain structure 124 is exposed, and the contact opening 130 is formed.

Many variations and/or modifications can be made to embodiments of the disclosure. In some other embodiments, one or more other dielectric layers are formed over the dielectric layer 128. Afterwards, the contact opening 130 is formed to penetrate these dielectric layers and expose the source/drain structure 124.

Afterwards, a modified region 132 is formed in the source/drain structure 124, as shown in FIG. 2C in accordance with some embodiments. In some embodiments, the modified region 132 extends along the entirety of the exposed surface of the source/drain structure 124. The modified region 132 has lower crystallinity than an inner portion of the source/drain structure 124, which may facilitate the subsequent formation of a metal-semiconductor region. The metal-semiconductor region may include a metal silicide layer that helps to reduce resistance between the source/drain structure 124 and a conductive contact to be formed over the source/drain structure 124. In some embodiments, the modified region 132 includes an amorphous region, a polycrystalline region, or a combination thereof. In some embodiments, the inner portion of the source/drain structure 124 is a single crystalline structure. In these cases, the modified region 132 has a smaller average grain size than that of the inner portion of the source/drain structure 124.

In some embodiments, the modified region 132 is formed using an implantation process 200. The implantation process 200 may be an ion implantation process. In some embodiments, the implantation process 200 is a plasma doping (PLAD) process. Plasma may be introduced into the contact opening 130 to form the modified region 132. In some embodiments, reaction gas used in the implantation process 200 includes silicon-containing gas, germanium-containing gas, argon-containing gas, helium-containing gas, one or more other suitable gases, or a combination thereof.

Figure 3:
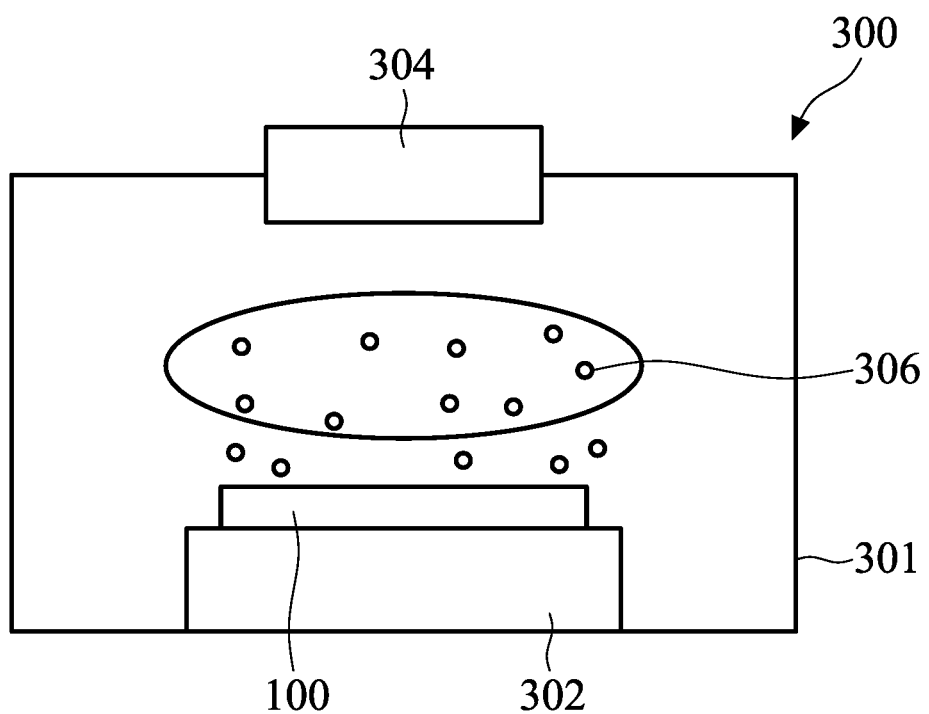
FIG. 3 is a schematic view of an implantation tool used for forming a modified region of a semiconductor device structure, in accordance with some embodiments.

FIG. 3 is a schematic view of an implantation tool 300 used for forming the modified region 132, in accordance with some embodiments. The implantation tool 300 includes a plasma chamber 301 that contains a substrate holder 302. The semiconductor substrate 100 may be placed on the substrate holder 302 in the plasma chamber 301 for being treated by the implantation process 200. The implantation tool 300 also includes a plasma generator 304. The plasma generator 304 may include an RF coil. The plasma generator 304 may be used to transform the introduced reaction gas into plasma 306. In some embodiments, the plasma 306 includes ions with different charges. The plasma 306 may include, for example, silicon-containing ions with different charges and/or silicon-containing radicals. The types of the plasma 306 may depend on the reaction gas used in the plasma chamber 301.

Because the plasma 306 includes ions with different charges, the plasma 306 may travel in various directions in the plasma chamber 301. In some embodiments, the generated plasma 306 is directly applied on the source/drain structure 124 without being filtered out. The source/drain structure 124 may be implanted from various directions. The sidewall surfaces of the source/drain structure 124 may have substantially the same chance to be implanted. Therefore, the modified region 132 may have a substantially uniform thickness along the sidewall surfaces of the source/drain structure 124.

Figure 4A:
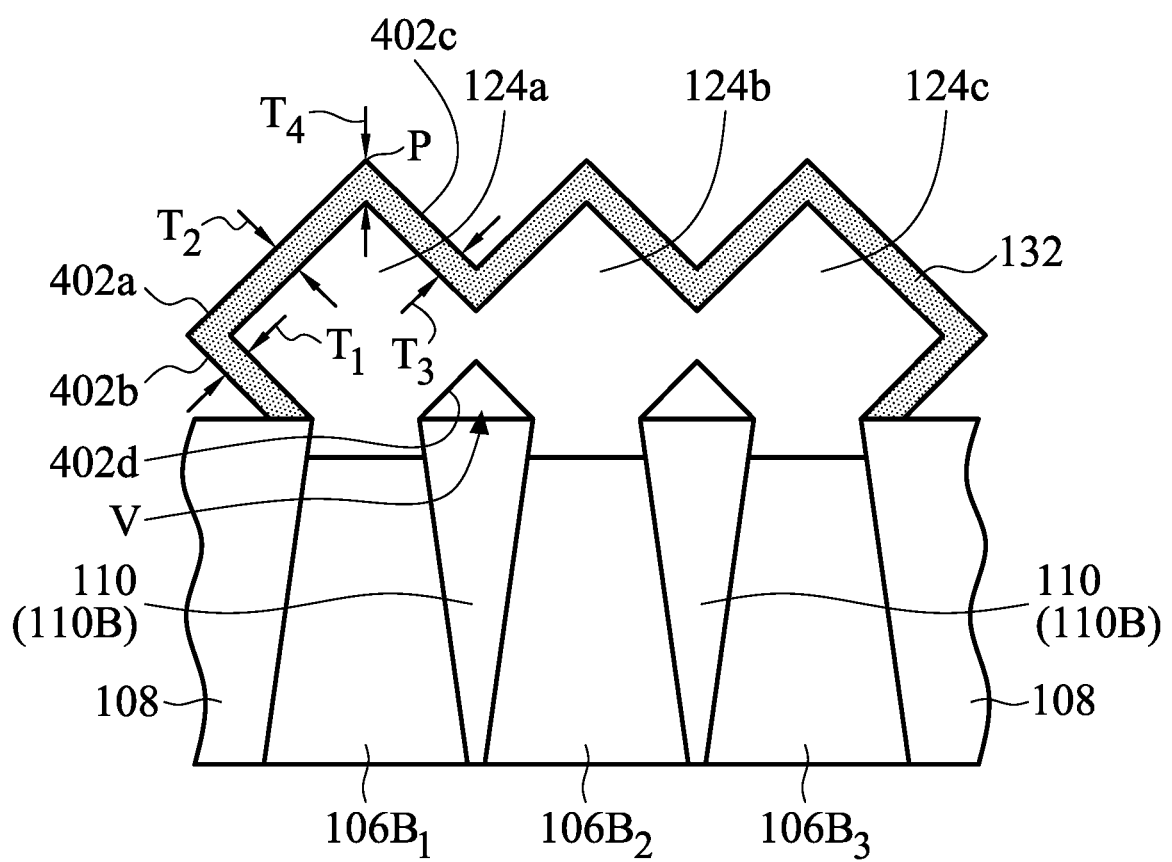
FIGS. 4A and 4B are cross-sectional views of various stages of a process for forming a semiconductor device structure, in accordance with some embodiments.
Figure 4B:
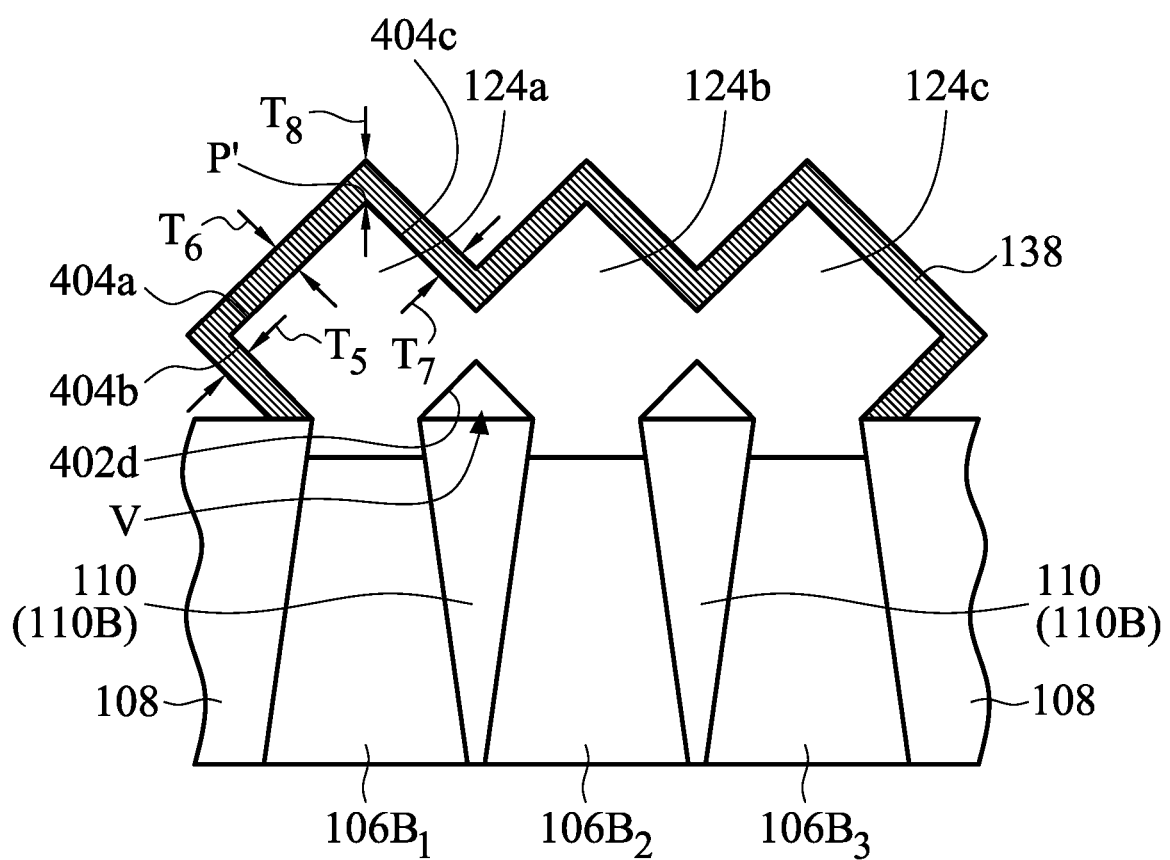

FIGS. 4A and 4B are a cross-sectional view of various stages of a process for forming a semiconductor device structure, in accordance with some embodiments. In some embodiments, FIG. 4A shows an enlarged view of a portion of the structure shown in FIG. 2C.

As shown in FIG. 4A, in some embodiments, multiple fin structures including $106B_1$, $106B_2$, and $106B_3$ are surrounded by the isolation structures 108 and 110B. In some embodiments, epitaxial structures 124a, 124b, and 124c are formed on the fin structures $106B_1$, $106B_2$, and $106B_3$, respectively. The epitaxial structures 124a, 124b, and 124c may together function as a source/drain structure 124. In some embodiments, one or each of the epitaxial structures 124a, 124b, and 124c has multiple facets (or slanted sidewall surfaces). As shown in FIG. 4A, the epitaxial structure 124a has a slanted sidewalls surface 402a facing upwards and a slanted sidewall surface 402b facing downwards. The epitaxial structure 124a also has a slanted sidewalls surface 402c facing upwards and a slanted sidewall surface 402d facing downwards. The epitaxial structure 124a also has a top plane P (or peak portion) connecting the slanted sidewall surfaces 402a and 402c.

In some embodiments, because the modified region 132 is formed using a plasma doping (PLAD) process, the modified region 132 formed in the epitaxial structures 124a, 124b, and 124c has a substantially uniform thickness along the sidewall surfaces. As shown in FIG. 4A, different portions of the modified region 132 have thicknesses such as $T_1$, $T_2$, and $T_3$. In some embodiments, the thicknesses $T_1$, $T_2$, and $T_3$ are substantially the same or similar. As mentioned above, the plasma 306 may travel in various directions to implant the epitaxial structures 124a, 124b, and 124c. Each of the exposed sidewall surfaces has similar chance to be implanted. As a result, the modified region 132 may have similar or substantially the same thickness along the sidewall surfaces. The top plane P may have more chance to be implanted than the sidewall surfaces. Therefore, the modified region 132 near the top plane P has a thickness $T_4$ that may be greater than the thickness $T_1$, $T_2$, or $T_3$. The thickness ratio ($T_1/T_2$) may be in a range from about 55% to about 65%.

Many variations and/or modifications can be made to embodiments of the disclosure. In some other embodiments, the implantation process 200 is not performed using plasma including ions with different charges. The implantation process 200 may be performed using ions with a single kind of charge. In these cases, the implantation process 200 may be performed multiple times with multiple incident implant angles. The modified region 132 having similar or substantially the same thickness along the sidewall surfaces may still be formed.

In some embodiments, the void V is a closed space surrounded by the slanted sidewall surfaces and the isolation structure 110. In some embodiments, the plasma 306 might not be easy to reach and modify the slanted sidewall surfaces surrounding the void V. Therefore, the modified region 132 may not extend along the slanted sidewall surfaces surrounding the void V. In some other embodiments, the void V is not completely closed. In these cases, the plasma 306 might still not be easy to reach and modify the slanted sidewall surfaces surrounding the void V.

Figure 2D:
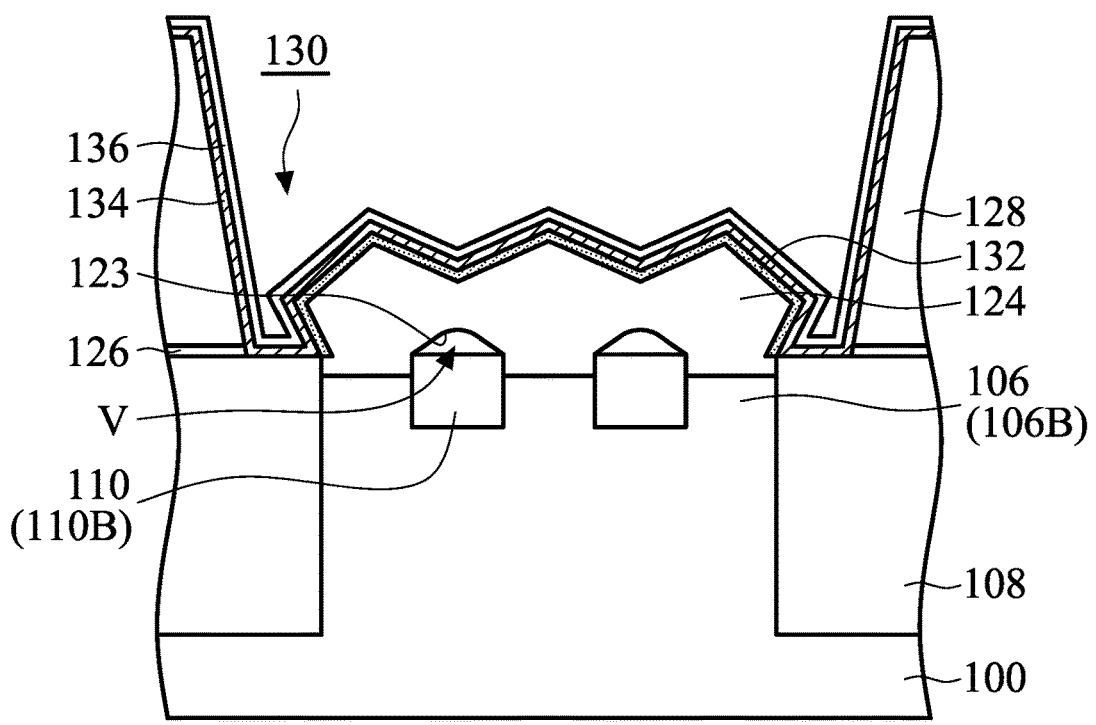

Reference is now made to FIG. 2D. In some embodiments, a metal layer 134 is deposited over the structure shown in FIG. 2C. In some embodiments, the metal layer 134 conformally extends along the exposed surface of the source/drain structure 124. In some embodiments, the metal layer 134 is in direct contact with the modified region 132. The metal layer 134 may be made of or include titanium, nickel, tantalum, cobalt, tungsten, platinum, one or more other suitable materials, or a combination thereof. The metal layer 134 may be deposited using a CVD process, a PVD process, an ALD process, an electroless plating process, an electroplating process, one or more other applicable processes, or a combination thereof.

Afterwards, a protective layer 136 is deposited over the metal layer 134, as shown in FIG. 2D in accordance with some embodiments. The protective layer 136 may be used to protect the metal layer 134 thereunder. Therefore, the metal layer 134 may be prevented from being oxidized or damaged before a subsequent process (such as a metal silicidation process). The protective layer 136 may be in-situ deposited in the same process chamber where the metal layer 134 is formed. The metal layer 134 is not exposed to outside environment before the formation of the protective layer 136. The metal layer 134 is thus well-protected.

The protective layer 136 may be made of or include a metal nitride material or other suitable material capable of preventing the metal layer 134 from being oxidized. The metal nitride material may include titanium nitride, cobalt nitride, tantalum nitride, platinum nitride, one or more other suitable materials, or a combination thereof. The protective layer 136 may be deposited using a CVD process, an ALD process, a PVD process, one or more other applicable processes, or a combination thereof.

Many variations and/or modifications can be made to embodiments of the disclosure. In some other embodiments, the protective layer 136 is not formed.

Figure 2E:
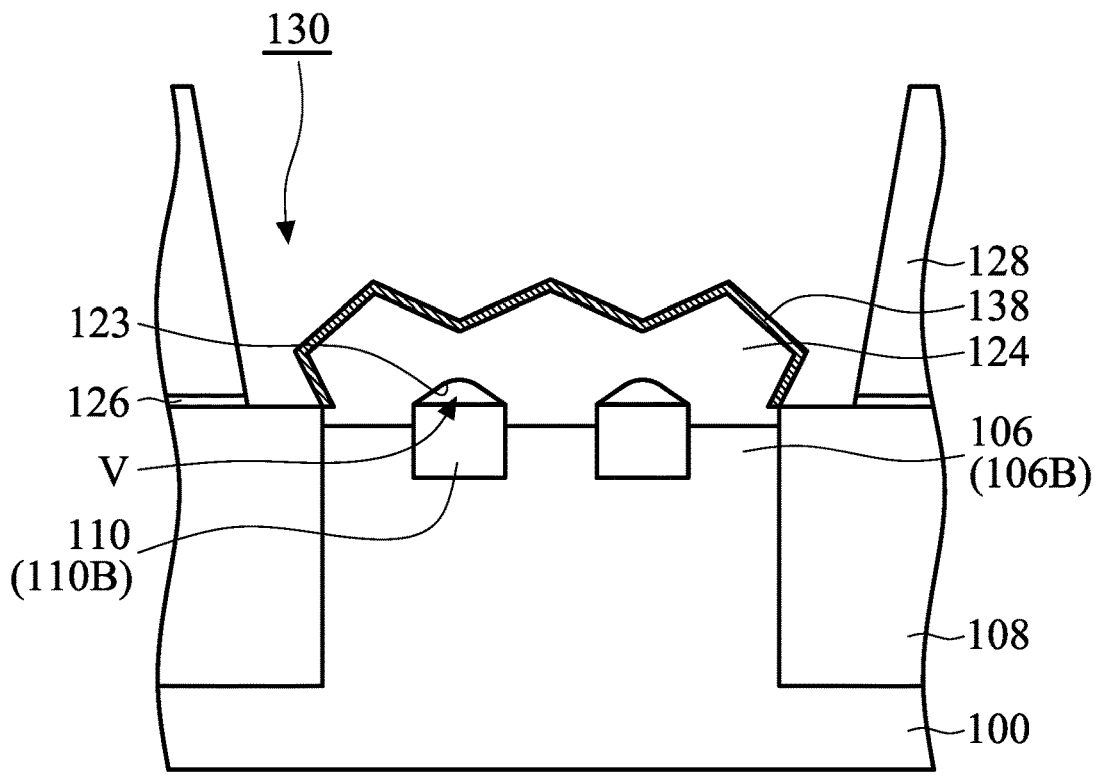

As shown in FIG. 2E, a semiconductor-metal compound layer 138 is formed on the source/drain structure 124, in accordance with some embodiments. A thermal operation may be used to heat the metal layer 134 and the modified region 132. A reaction may be initiated between the metal layer 134 and the modified region 132 in the source/drain structure 124. As a result, the semiconductor-metal compound layer 138 is formed. All or some of the modified region 132 may be transformed into the semiconductor-metal compound layer 138. The semiconductor-metal compound layer 138 may be made of or include silicon-metal compound material (such as metal silicide), germanium-metal compound material, one or more other suitable semiconductor-metal compound material, or a combination thereof.

The thermal operation may be a thermal soaking process, spike annealing process, a flash annealing process, a laser annealing process, one or more other applicable processes, or a combination thereof. In some embodiments, the thermal operation is operated at a temperature in a range from about 500 degrees C. to about 700 degrees C. The thermal operation time may be in a range from about 10 seconds to about 90 seconds. In some embodiments, the thermal operation is performed in an atmosphere that is substantially free of oxygen.

After the formation of the semiconductor-metal compound layer 138, the remaining portion of the metal layer 134 and the protective layer 136 are removed, as shown in FIG. 2E. In some embodiments, the remaining portion of the metal layer 134 and the protective layer 136 are removed using one or more etching processes.

Many variations and/or modifications can be made to embodiments of the disclosure. In some other embodiments, the remaining portion of the metal layer 134 is nitrogenized to become a metal nitride layer. The metal nitride layer and the protective layer 136 may together function as a barrier layer. The barrier layer may prevent metal ions of a subsequently formed conductive contact from diffusing into the dielectric layer 128. In some embodiments, the metal layer 134 and/or the metal nitride layer may be partially removed to be thinner so as to reduce the aspect ratio of the contact opening 130. The subsequent contact formation may therefore be easier to perform.

In some embodiments, FIG. 4B shows an enlarged view of a portion of the structure shown in FIG. 2E. After the formation of the semiconductor-metal compound layer 138, the epitaxial structure 124a has a slanted sidewalls surface 404a facing upwards and a slanted sidewall surface 404b facing downwards. The epitaxial structure 124a also has a slanted sidewalls surface 404c facing upwards and a slanted sidewall surface 404d facing downwards. The epitaxial structure 124a also has a top plane P' (or peak portion) connecting the slanted sidewall surfaces 404a and 404c As mentioned above, the modified region 132 formed in the epitaxial structures 124a, 124b, and 124c has a substantially uniform thickness along the sidewall surfaces. Accordingly, the semiconductor-metal compound layer 138 also has a substantially uniform thickness along the sidewall surfaces of the epitaxial structures 124a, 124b, and 124c.

As shown in FIG. 4B, different portions of the semiconductor-metal compound layer 138 have thicknesses such as $T_5$, $T_6$, and $T_7$. In some embodiments, the thicknesses $T_5$, $T_6$, and $T_7$ are substantially the same or similar. In some embodiments, the semiconductor-metal compound layer 138 near the top plane P has a thickness $T_8$ that may be greater than the thickness $T_5$, $T_6$, and $T_7$. The thickness ratio ($T_5/T_8$) may be in a range from about 55% to about 65%. The thickness $T_8$ may be in a range from about 2 nm to about 10 nm.

As shown in FIG. 4B, the epitaxial structures 124a and 124b connect together to surround a space, such as the void V, in accordance with some embodiments. The epitaxial structure 124b also has slanted sidewalls surfaces facing upwards. The semiconductor-metal compound layer 138 also extends along these slanted sidewall surfaces. In some embodiments, the semiconductor-metal compound layer 138 does not extend along the slanted sidewall surfaces surrounding the void, as shown in FIG. 4B.

Figure 2F:
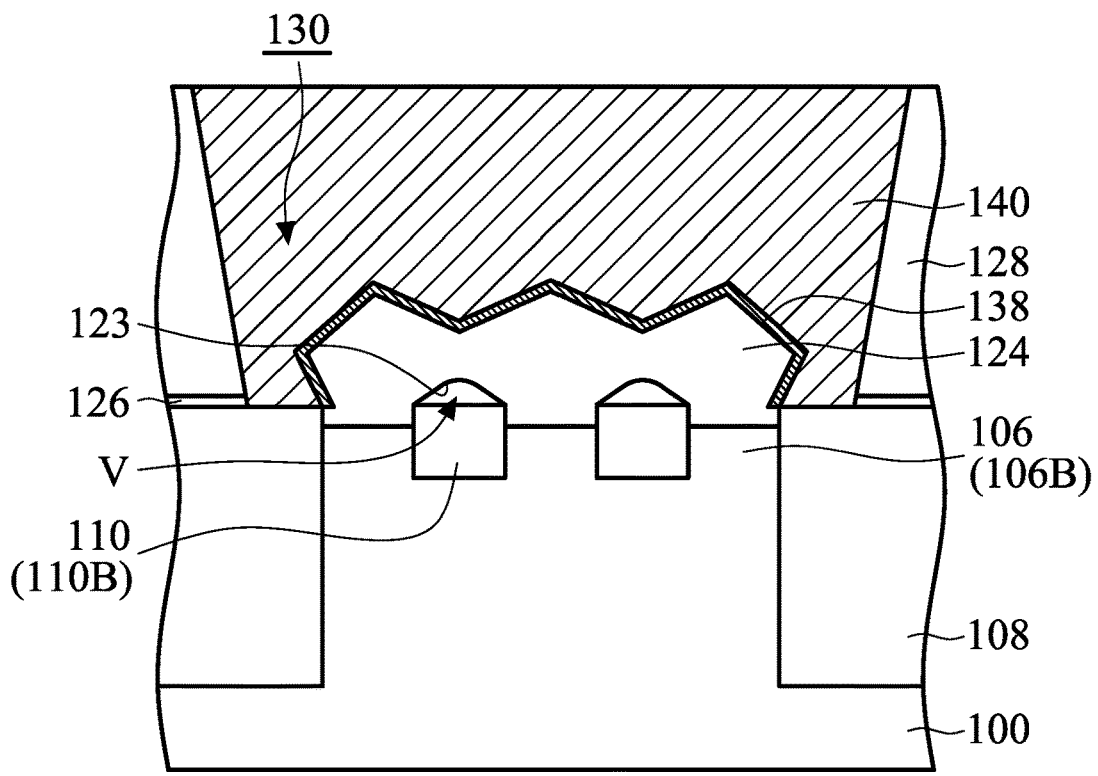

As shown in FIG. 2F, a conductive structure 140 is formed on the semiconductor-metal compound layer 138, in accordance with some embodiments. The conductive structure 140 may be used as a conductive contact. In some embodiments, the conductive structure 140 is electrically connected to the source/drain structure 124. In some embodiments, the semiconductor-metal compound layer 138 separates the conductive structure 140 from the source/drain structure 124.

The conductive structure 140 may be made of or include tungsten, cobalt, platinum, gold, copper, aluminum, one or more other suitable materials, or a combination thereof. In some embodiments, a conductive material is formed to fill the contact opening 130. Afterwards, a planarization process may be used to remove the conductive material outside of the contact opening 130. As a result, the conductive structure 140 is formed.

In some embodiments, the semiconductor-metal compound layer 138 extends in a substantially conformal manner along the slanted sidewall surfaces (such as the slanted sidewall surfaces 404a, 404b, and 404c) of the source/drain structure 124, as shown in FIGS. 2F and 4B. Most portions of the semiconductor-metal compound layer 138 have a sufficient thickness. In some embodiments, the entire surface of the source/drain structure 124 that is originally exposed by the contact opening 130 is covered by the semiconductor-metal compound layer 138. Therefore, contact surface between the conductive structure 130 and the semiconductor-metal compound layer 138 is large. Accordingly, resistance between the conductive structure 140 and the source/drain structure 124 is significantly reduced. The performance and reliability of the semiconductor device structure are improved.

Figure 5:
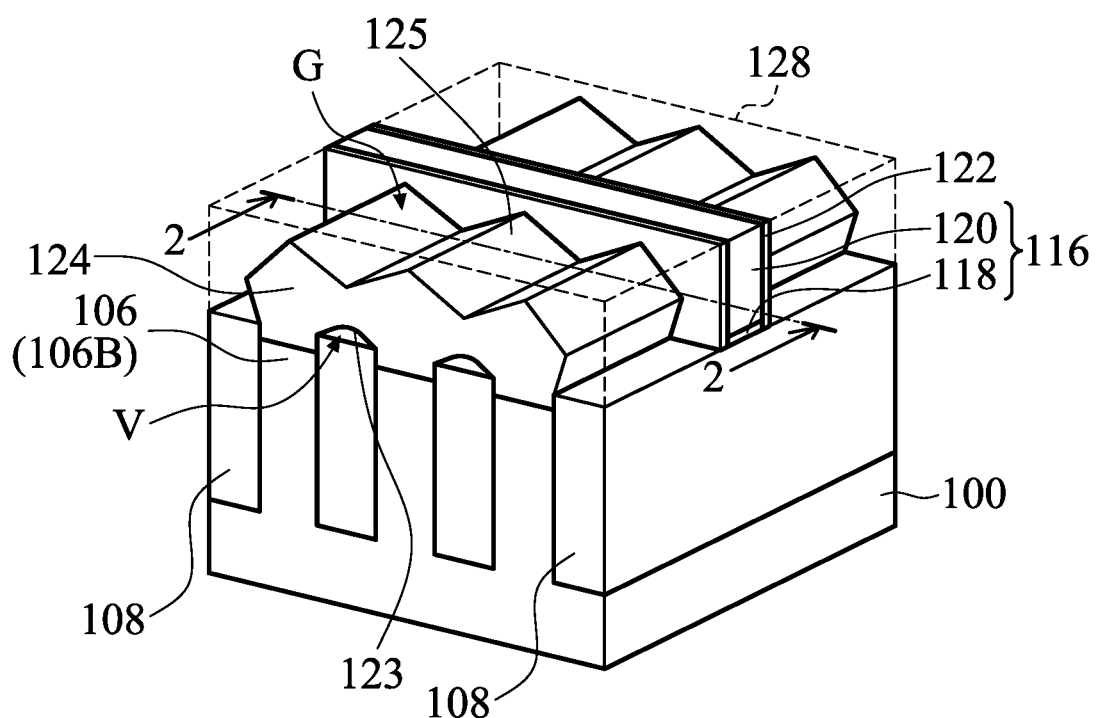
FIG. 5 is a perspective view of an intermediate stage of a process for forming a semiconductor device structure, in accordance with some embodiments.

Many variations and/or modifications can be made to embodiments of the disclosure. FIG. 5 is a perspective view of an intermediate stage of a process for forming a semiconductor device structure, in accordance with some embodiments. FIG. 5 shows a structure similar to the structure shown in FIG. 1G. In some embodiments, the semiconductor fins 106 have a non-crown structure. In some embodiments, the semiconductor fins 106 are between dummy fins (not shown). Each of the dummy fins may have a smaller height than that of the semiconductor fin 106.

Figure 6:
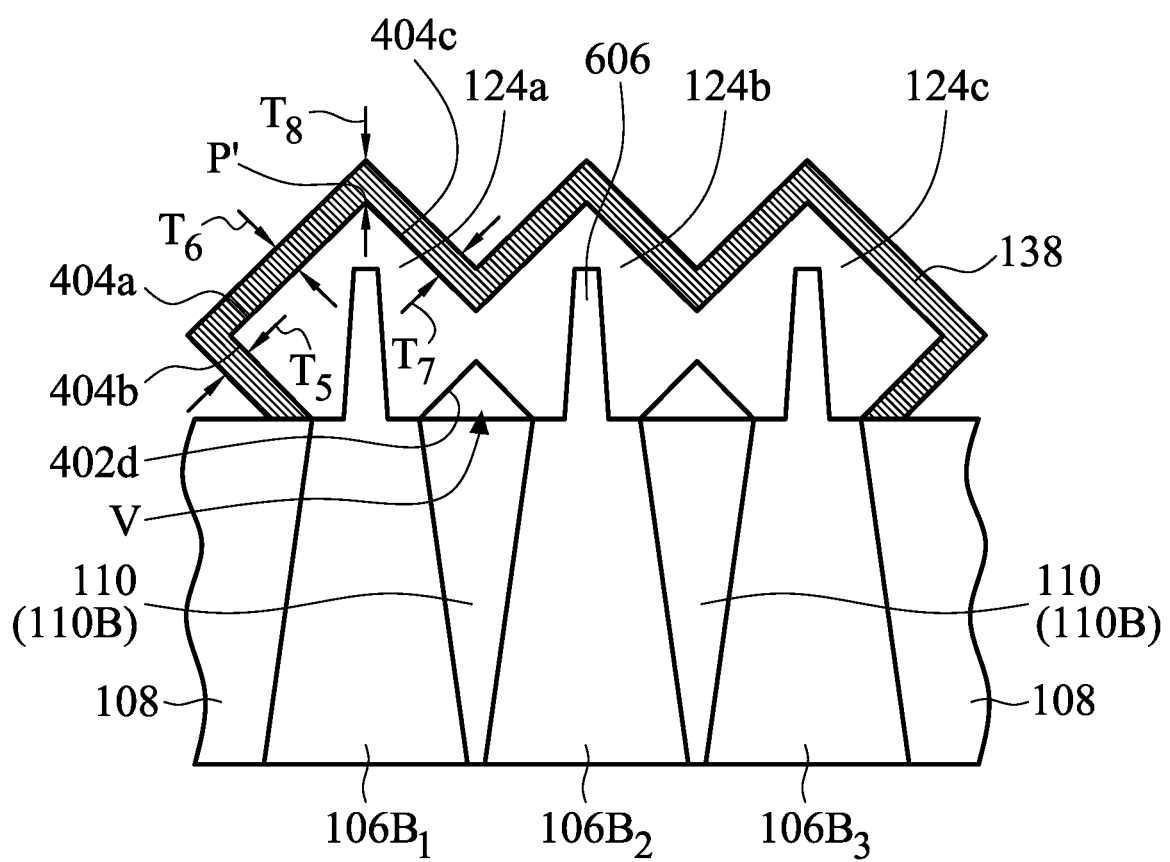
FIG. 6 is a cross-sectional view of an intermediate stage of a process for forming a semiconductor device structure, in accordance with some embodiments.

Many variations and/or modifications can be made to embodiments of the disclosure. FIG. 6 is a cross-sectional view of an intermediate stage of a process for forming a semiconductor device structure, in accordance with some embodiments. FIG. 6 shows a structure similar to the structure shown in FIG. 4B. In some embodiments, the upper portions 606 of the fin structures $106B_1$, $106B_2$, and $106B_3$ are not completely removed. The upper portions 606 of the fin structures $106B_1$, $106B_2$, and $106B_3$ are partially removed to be thinner. The upper portions 606 of the fin structures $106B_1$, $106B_2$, and $106B_3$ may facilitate the growth of the epitaxial structures 124a, 124b, and 124c.

Embodiments of the disclosure form a semiconductor device structure with a FinFET device. Epitaxial structures are formed over semiconductor fins and positioned adjacent to a gate stack. An implantation process is used to form a modified region in the epitaxial structures. The implantation process may involve plasma. The plasma used may include ions with different charges. The modified region has lower crystallinity and extends along an entirety of an exposed surface of the epitaxial structure. A semiconductor-metal compound layer formed afterwards also extends along the entirety of the exposed surface of the epitaxial structure and has sufficient thicknesses. The resistance between the epitaxial structures and subsequently formed conductive contacts is thus significantly reduced. The performance and reliability of the semiconductor device structure are greatly improved.

In accordance with some embodiments, a method for forming a semiconductor device structure is provided. The method includes forming a fin structure over a semiconductor substrate and forming a gate stack over the fin structure. The method also includes forming an epitaxial structure over the fin structure, and the epitaxial structure is adjacent to the gate stack. The method further includes forming a dielectric layer over the epitaxial structure and the gate stack and forming an opening in the dielectric layer to expose the epitaxial structure. In addition, the method includes forming a modified region in the epitaxial structure. The modified region has lower crystallinity than an inner portion of the epitaxial structure and extends along an entirety of an exposed surface of the epitaxial structure. The method also includes forming a semiconductor-metal compound region on the epitaxial structure. A portion or an entirety of the modified region is transformed into the semiconductor-metal compound region. The method further includes forming a conductive structure over the semiconductor-metal compound region, and the conductive structure is in direct contact with the semiconductor-metal compound region.

In accordance with some embodiments, a method for forming a semiconductor device structure is provided. The method includes forming a fin structure over a semiconductor substrate and forming a gate stack over the fin structure. The method also includes forming a source/drain structure over the fin structure, and the source/drain structure is adjacent to the gate stack. The method further includes applying plasma on the source/drain structure to form a modified region in the source/drain structure. The modified region has lower crystallinity than an inner portion of the epitaxial structure, and the modified region extends along an exposed surface of the source/drain structure. In addition, the method includes forming a metal layer on the exposed surface of the source/drain structure. The method also includes heating the metal layer and the modified region to form a metal-semiconductor compound region. The metal-semiconductor compound region extends along the exposed surface of the source/drain structure.

In accordance with some embodiments, a semiconductor device structure is provided. The semiconductor device structure includes a fin structure over a semiconductor substrate and a gate stack over the fin structure. The semiconductor device structure also includes an epitaxial structure over the fin structure. The epitaxial structure is adjacent to the gate stack, and the epitaxial structure has a first slanted sidewall surface facing upwards and a second slanted sidewall surface facing downwards. The semiconductor device structure further includes a conductive contact electrically connected to the epitaxial structure. In addition, the semiconductor device structure includes a metal-semiconductor compound layer extending along the first slanted sidewall surface and the second slanted sidewall surface and physically separating the conductive contact and the epitaxial structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:
   forming a fin structure over a semiconductor substrate;
   forming a gate stack over the fin structure;
   forming an epitaxial structure over the fin structure, wherein the epitaxial structure is adjacent to the gate stack;
   forming a dielectric layer over the epitaxial structure and the gate stack;
   forming an opening in the dielectric layer to expose the epitaxial structure;
   forming a modified region in the epitaxial structure, wherein the modified region has lower crystallinity than an inner portion of the epitaxial structure, the modified region is formed by generating and introducing plasma into the opening, the plasma includes ions with different charges and is directly introduced into the opening without being filtered out, and the modified region extends along an entirety of an exposed surface of the epitaxial structure;
   forming a semiconductor-metal compound region on the epitaxial structure, wherein at least a portion of the modified region is transformed into the semiconductor-metal compound region; and
   forming a conductive structure over the semiconductor-metal compound region, wherein the conductive structure is in direct contact with the semiconductor-metal compound region.

2. The method for forming a semiconductor device structure as claimed in claim 1, wherein reaction gas used for generating the plasma includes silicon-containing gas, germanium-containing gas, argon-containing gas, helium-containing gas, or a combination thereof.

3. The method for forming a semiconductor device structure as claimed in claim 1, wherein the modified region comprises an amorphous region, a polycrystalline region, or a combination thereof.

4. The method for forming a semiconductor device structure as claimed in claim 1, further comprising:
   forming a metal layer directly on the modified region; and
   heating the metal layer and the modified region to initiate a reaction between the metal layer and the modified region to form the semiconductor-metal compound region.

5. The method for forming a semiconductor device structure as claimed in claim 4, further comprising forming a protective layer on the metal layer before heating the metal layer and the modified region.

6. The method for forming a semiconductor device structure as claimed in claim 5, further comprising removing the protective layer before the conductive structure is formed and after the semiconductor-metal compound region is formed.

7. The method for forming a semiconductor device structure as claimed in claim 4, further comprising forming an isolation structure to surround a lower portion of the fin structure, wherein the opening exposes a portion of the isolation structure, and the metal layer is in direct contact with the portion of the isolation structure before the semiconductor-metal compound region is formed.

8. The method for forming a semiconductor device structure as claimed in claim 1, further comprising partially removing the fin structure before the epitaxial structure is formed.

9. The method for forming a semiconductor device structure as claimed in claim 1, wherein the plasma includes silicon-containing ions with different charges, silicon-containing radicals, or a combination thereof.

10. The method for forming a semiconductor device structure as claimed in claim 1, further comprising forming an isolation structure to surround a lower portion of the fin structure, wherein the opening exposes a portion of the isolation structure.

11. A method for forming a semiconductor device structure, comprising:
    forming a fin structure over a semiconductor substrate;
    forming a gate stack over the fin structure;
    forming a source/drain structure over the fin structure, wherein the source/drain structure is adjacent to the gate stack;
    generating and applying plasma on the source/drain structure to form a modified region in the source/drain structure, wherein the plasma is directly applied on the source/drain structure without being filtered out, the plasma includes ions with different charges, the modified region has lower crystallinity than an inner portion of the source/drain structure, and the modified region extends along an exposed surface of the source/drain structure;
    forming a metal layer on the exposed surface of the source/drain structure; and
    heating the metal layer and the modified region to form a metal-semiconductor compound region, wherein the metal-semiconductor compound region extends along the exposed surface of the source/drain structure.

12. The method for forming a semiconductor device structure as claimed in claim 11, further comprising partially removing the fin structure before the source/drain structure is formed.

13. The method for forming a semiconductor device structure as claimed in claim 11, further comprising forming a metal nitride layer over the metal layer before heating the metal layer and the modified region.

14. The method for forming a semiconductor device structure as claimed in claim 11, wherein the modified region extends along an entirety of the exposed surface of the source/drain structure.

15. The method for forming a semiconductor device structure as claimed in claim 11, wherein the plasma includes silicon-containing ions with different charges, silicon-containing radicals, or a combination thereof.

16. A method for forming a semiconductor device structure, comprising:
    forming an epitaxial structure over a semiconductor substrate;
    generating and applying plasma on an entire exposed surface of the epitaxial structure to form a modified region in the epitaxial structure, wherein the plasma is directly applied on the source/drain structure without being filtered out, the plasma includes ions with different charges, the modified region has lower crystallinity than an inner portion of the epitaxial structure, and the modified region extends along the entire exposed surface of the epitaxial structure;
    forming a metal layer on the entire exposed surface of the epitaxial structure; and heating the metal layer and the modified region to form a metal-semiconductor compound region.

17. The method for forming a semiconductor device structure as claimed in claim 16, further comprising forming a protection layer over the metal layer before heating the metal layer and the modified region.

18. The method for forming a semiconductor device structure as claimed in claim 17, wherein the protective layer is made of a metal nitride material.

19. The method for forming a semiconductor device structure as claimed in claim 16, wherein reaction gas used for generating the plasma includes silicon-containing gas, germanium-containing gas, argon-containing gas, helium-containing gas, or a combination thereof.

20. The method for forming a semiconductor device structure as claimed in claim 16, wherein the plasma includes silicon-containing ions with different charges, silicon-containing radicals, or a combination thereof.

* * * * *